(12) United States Patent
Tung et al.

(10) Patent No.: US 10,779,442 B2
(45) Date of Patent: Sep. 15, 2020

(54) METHOD FOR VERIFYING IMMERSION COOLING SYSTEM

(71) Applicants: INVENTEC (PUDONG) TECHNOLOGY CORPORATION, Shanghai (CN); INVENTEC CORPORATION, Taipei (TW)

(72) Inventors: Kai-Yang Tung, Taipei (TW); Hung-Ju Chen, Taipei (TW)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 318 days.

(21) Appl. No.: 15/867,605

(22) Filed: Jan. 10, 2018

(65) Prior Publication Data
US 2019/0166726 A1    May 30, 2019

(30) Foreign Application Priority Data
Nov. 30, 2017  (CN) .......................... 2017 1 1233268

(51) Int. Cl.
| H05K 7/20 | (2006.01) |
| G01F 25/00 | (2006.01) |
| G01P 21/00 | (2006.01) |
| G01K 15/00 | (2006.01) |

(52) U.S. Cl.
CPC ..... *H05K 7/20836* (2013.01); *G01F 25/0007* (2013.01); *G01F 25/0076* (2013.01); *G01K 15/007* (2013.01); *G01P 21/00* (2013.01); *H05K 7/20236* (2013.01); *H05K 7/20763* (2013.01)

(58) Field of Classification Search
CPC ............ H05K 7/20836; H05K 7/20236; G01F 25/007; G01F 25/0076; G01P 21/00; G01K 15/007
See application file for complete search history.

(56) References Cited

U.S. PATENT DOCUMENTS

| 2010/0299099 A1* | 11/2010 | Yamaoka | ............. F24F 11/0001 702/130 |
| 2016/0115395 A1* | 4/2016 | Rustad | .................... E21B 37/06 700/282 |
| 2017/0303443 A1* | 10/2017 | Inano | ...................... G06F 1/206 |

FOREIGN PATENT DOCUMENTS

KR          101824999 B1 *  2/2018

* cited by examiner

*Primary Examiner* — David Z Huang
(74) *Attorney, Agent, or Firm* — Maschoff Brennan

(57) ABSTRACT

The disclosure is related to a method for verifying an immersion cooling system. The immersion cooling system includes a first sensor, a second sensor and at least one third sensor. The method includes: obtaining a first difference value; determining whether the first difference value is smaller than a first threshold value; determining that the first sensor and the second sensor are in normal operation when the first difference value is smaller than the first threshold value; when the first difference value is not smaller than the first threshold value, determining an operating condition of the first sensor or the second sensor according to a relationship between a sensor value of the at least one third sensor and the sensor value of the first sensor, or a relationship between the sensor value of the at least one third sensor and the sensor value of the second sensor.

9 Claims, 8 Drawing Sheets

METHOD FOR VERIFYING IMMERSION COOLING SYSTEM

CROSS-REFERENCE TO RELATED APPLICATIONS

This non-provisional application claims priority under 35 U.S.C. § 119(a) on Patent Application No(s). 201711233268.X filed in China. on Nov. 30, 2017, the entire contents of which are hereby incorporated by reference.

BACKGROUND OF THE INVENTION

Technical Field of the Invention

The disclosure relates to a method, more particularly a method for verifying immersion cooling system.

Description of the Related Art

In order to prevent a server from exceeding the design limit, sensors are given predetermined threshold values. When a sensor value exceeds the predetermined threshold value, a system in the server activates actions, such as recording, underclocking, and forced shutdown. However, there is no consideration for a condition that the sensor might be in abnormal operation while it is detected exceeding the predetermined threshold value. When a wrong signal of the abnormal sensor is delivered, the said actions might be unnecessarily activated, and even the server that is in normal operation might be forced to shut down, causing data lost.

SUMMARY OF THE INVENTION

One embodiment of the disclosure provides a method for verifying an immersion cooling system. The immersion cooling system includes a first sensor, a second sensor and at least one third sensor. The method includes: obtaining a first difference value of the immersion cooling system by comparing a sensor value of the first sensor with a sensor value of the second sensor; determining whether the first difference value is smaller than a first threshold value; determining that the first sensor and the second sensor are in normal operation when the first difference value is smaller than the first threshold value; when the first difference value is not smaller than the first threshold value, determining an operating condition of the first sensor or the second sensor according to a relationship between a sensor value of the at least one third sensor and the sensor value of the first sensor, or a relationship between the sensor value of the at least one third sensor and the sensor value of the second sensor.

One embodiment of the disclosure provides a method for verifying an immersion cooling system. The immersion cooling system includes a rotational speed sensor and a flow sensor. The method includes: obtaining a rotational speed of a pump of a cooling module of the immersion cooling system by the rotational speed sensor, and obtaining a pump flow rate of the pump by the flow sensor while the pump is in full-load operation; determining whether the rotational speed falls within a predetermined rotational speed range, and whether the pump flow rate falls within a predetermined flow-rate range; when the rotational speed falls within the predetermined rotational speed range, and the pump flow rate falls within the predetermined flow-rate range, determining that the rotational speed sensor and the flow sensor are in normal operation; when only the pump flow rate falls outside the predetermined flow-rate range, determining that the rotational speed sensor is in normal operation and the flow sensor is in abnormal operation; when the rotational speed falls outside the predetermined rotational speed range, and the pump flow rate falls within the predetermined flow-rate range, determining that the rotational speed sensor is in abnormal operation and the flow sensor is in normal operation; when both the rotational speed and the pump flow rate respectively fall outside the predetermined flow-rate range and the predetermined flow-rate range, determining that the pump is in abnormal operation.

BRIEF DESCRIPTION OF THE DRAWINGS

The disclosure will become more fully understood from the detailed description given herein below and the accompanying drawings which are given by way of illustration only and thus are not limitative to the present disclosure and wherein.

DETAILED DESCRIPTION

Figure 1:
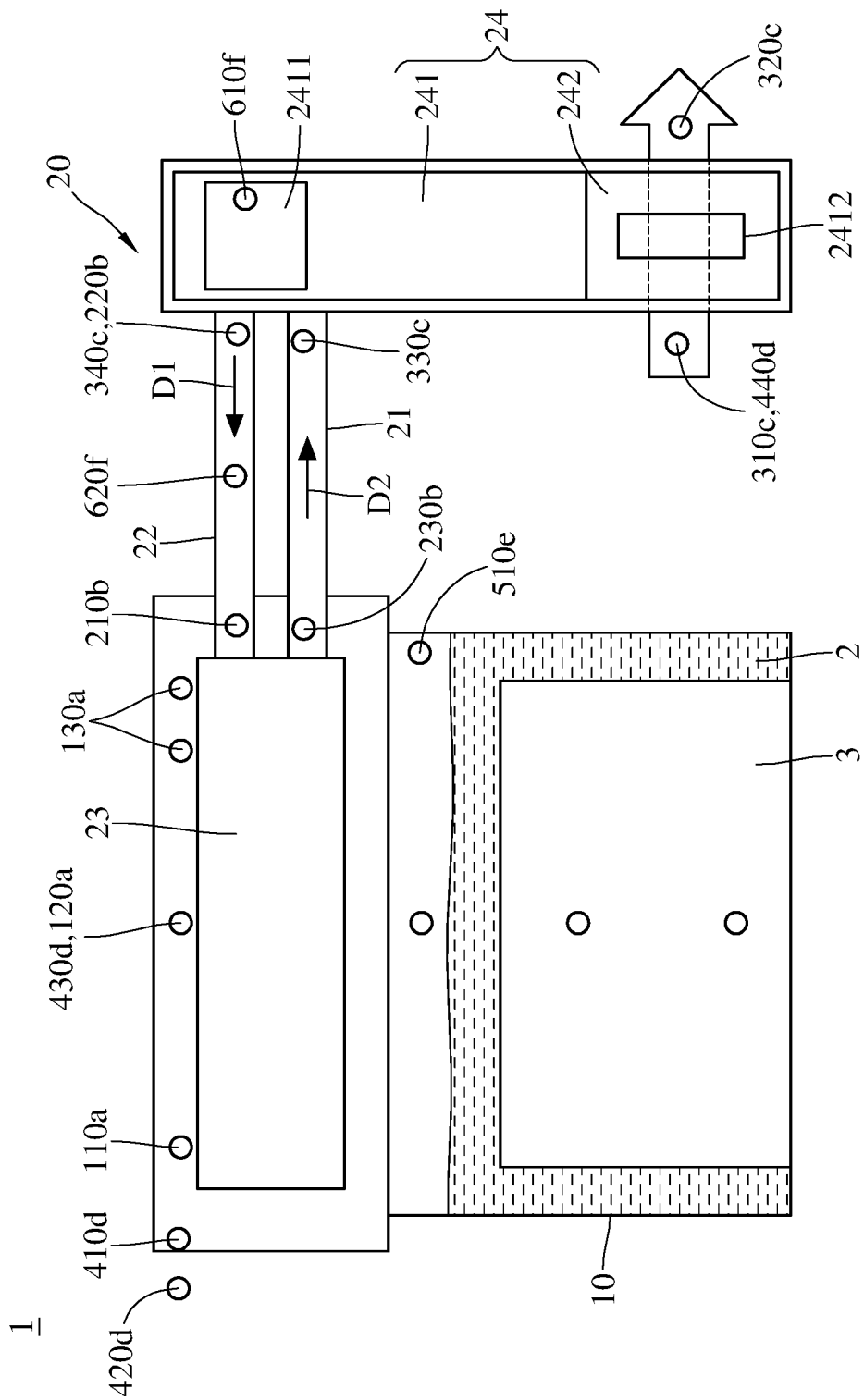
FIG. 1 is a schematic view of an immersion cooling system adapted to a method for verifying immersion cooling system.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Please refer to FIG. 1. FIG. 1 is a schematic view of an immersion cooling system adapted to a method for verifying immersion cooling system. An immersion cooling system 1 is provided, and the immersion cooling system 1 includes a liquid storage tank 10 and a cooling circulation system 20. The liquid storage tank 10 has a dielectric fluid 2 and a heat source 3 inside, and the heat source 3 is immersed in the dielectric fluid 2, such that heat generated by the heat source 3 is absorbed by the dielectric fluid 2. The heat source is, for example, electronic devices in a server. The dielectric fluid 2 will be vaporized into a gaseous form. The cooling circulation system 20 is configured to condense the gaseous form of the dielectric fluid 2 into its liquid form. The cooling circulation system 20 includes an input tube 21, an output tube 22, a heat radiator 23 and a cooling module 24. Two opposite ends of the input tube 21 and two opposite ends of the output tube 22 are respectively connected to the heat radiator 23 and the cooling module 24; that is, the input tube 21 and the output tube 22 are located between and connected to the heat radiator 23 and the cooling module 24. The heat radiator 23 is disposed above the dielectric fluid 2. The cooling module 24 has a liquid side 241 and an air side 242. A pump 2411 is disposed at the liquid side 241 and is configured to deliver coolant in low temperature from the liquid side 241 to the heat radiator 23 through the output tube 22 along a direction D1, so that the coolant is able to thermally exchange with the dielectric fluid 2 in gaseous form. After that, the temperature of the coolant will be raised, the coolant in high temperature will be delivered back to the liquid side 241 of the cooling module 24 through the input tube 21 along a direction D2. There is a fan 2412 disposed at the air side 242 and is configured to cool the coolant in high temperature while it flows back to the cooling module 24.

Figure 2:
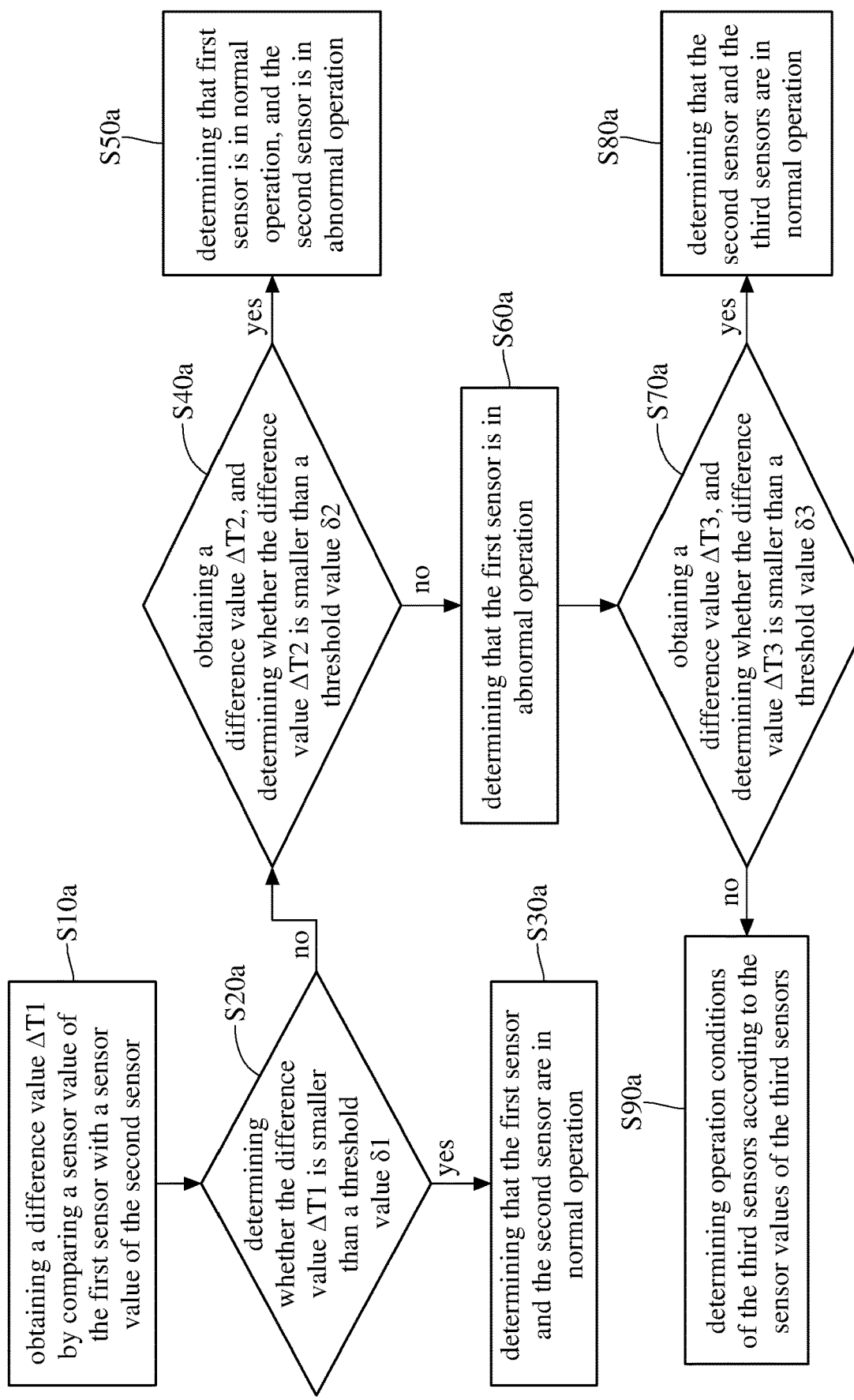
FIG. 2 is a flow chart of a method for verifying immersion cooling system according to a first embodiment of the disclosure.

Please refer to FIG. 1 and FIG. 2 together. FIG. 2 is a flow chart of a method for verifying immersion cooling system according to a first embodiment of the disclosure.

In this embodiment, the immersion cooling system 1 includes a first sensor 110a, a second sensor 120a and a plurality of third sensors 130a. A method for verifying the immersion cooling system 1 includes a plurality of steps—step S10a to step S80a: step S10a includes obtaining a difference value ΔT1 of the immersion cooling system 1 by comparing a sensor value of the first sensor 110a with a sensor value of the second sensor 120a; step S20a includes determining whether the difference value ΔT1 is smaller than a threshold value δ1; step S30a includes determining that the first sensor 110a and the second sensor 120a are in normal operation when the difference value ΔT1 is smaller than the threshold value δ1; step S40a is performed when the difference value ΔT1 is not smaller than the first threshold value δ1, wherein the step S40a includes obtaining a difference value ΔT2 of the immersion cooling system 1 by comparing the sensor value of the first sensor 110a with an average sensor value of the third sensors 130a, and determining whether the difference value ΔT2 is smaller than a threshold value δ2; step S50a is performed when the difference value ΔT2 is smaller than the threshold value δ2, wherein the step S50a includes determining that first sensor 110a is in normal operation, and the second sensor 120a is in abnormal operation; step S60a is performed when the difference value ΔT2 is not smaller than the threshold value δ2, wherein the step S60a includes determining that the first sensor 110a is in abnormal operation; step S70a includes obtaining a difference value ΔT3 by comparing the sensor value of the second sensor 120a with the average sensor value of the third sensors 130a, and determining whether the difference value ΔT3 is smaller than a threshold value δ3; step S80a is performed when the difference value ΔT3 is smaller than the threshold value δ3, wherein the step S80a includes determining that the second sensor 120a and the third sensors 130a are in normal operation, and replacing the sensor value of the first sensor 110a with the highest sensor value of the third sensors 130a; and step S90a is performed when the difference value ΔT3 is not smaller than the threshold value δ3, wherein the step S90a includes determining that the second sensor 120a is in abnormal operation, and determining operation conditions of the third sensors 130a according to the sensor values of the third sensors 130a.

The first sensor 110a, second sensor 120a, and third sensors 130a are able to detect gas temperatures in the liquid storage tank 10. Assuming that the first sensor 110a has the highest sensor value, the second sensor 120a has the lowest sensor value, and the average sensor value of the third sensors 130a is lower than the highest sensor value and higher than the lowest sensor value.

In such as case, when the difference value ΔT1 between the sensor value of the first sensor 110a (the highest) and the sensor value of the second sensor 120a (the lowest) is smaller than the threshold value δ1, such as 2° C., it is determined that the first sensor 110a and the second sensor 120a are in normal operation. However, when the difference value ΔT1 is larger than the threshold value δ1, it is determined that the first sensor 110a or the second sensor 120a is in abnormal operation. Therefore, there is a need to further compare the difference value ΔT2, between the sense value of the first sensor 110a and the average sense value of the third sensors 130a, with the threshold value δ2 to determine which sensor is in normal operation. When the difference value ΔT2 is smaller than the threshold value δ2, it is determined that the first sensor 110a is in normal operation, and the second sensor 120a is in abnormal operation. When the difference value ΔT2 is larger than the second threshold value δ2, the sensor value of the second sensor 120a is compared with the average sensor value of the third sensors 130a to obtain the difference value ΔT3. When the difference value ΔT3 is smaller than the threshold value δ3, it is determined that the second sensor 120a and the third sensors 130a are in normal operation, and the abnormal sensor value of the first sensor 110a is replaced with the highest sensor value of the third sensors 130a; that is, the highest value is replaced with the second-highest value. When the difference value ΔT3 is larger than the threshold value δ3, it is determined that the second sensor 120a is in abnormal operation, and the operation conditions of the third sensors 130a are determined by the sensor values of the third sensors 130a; that is, the operation conditions of the third sensors 130a would be verified by the aforementioned steps.

Figure 3:
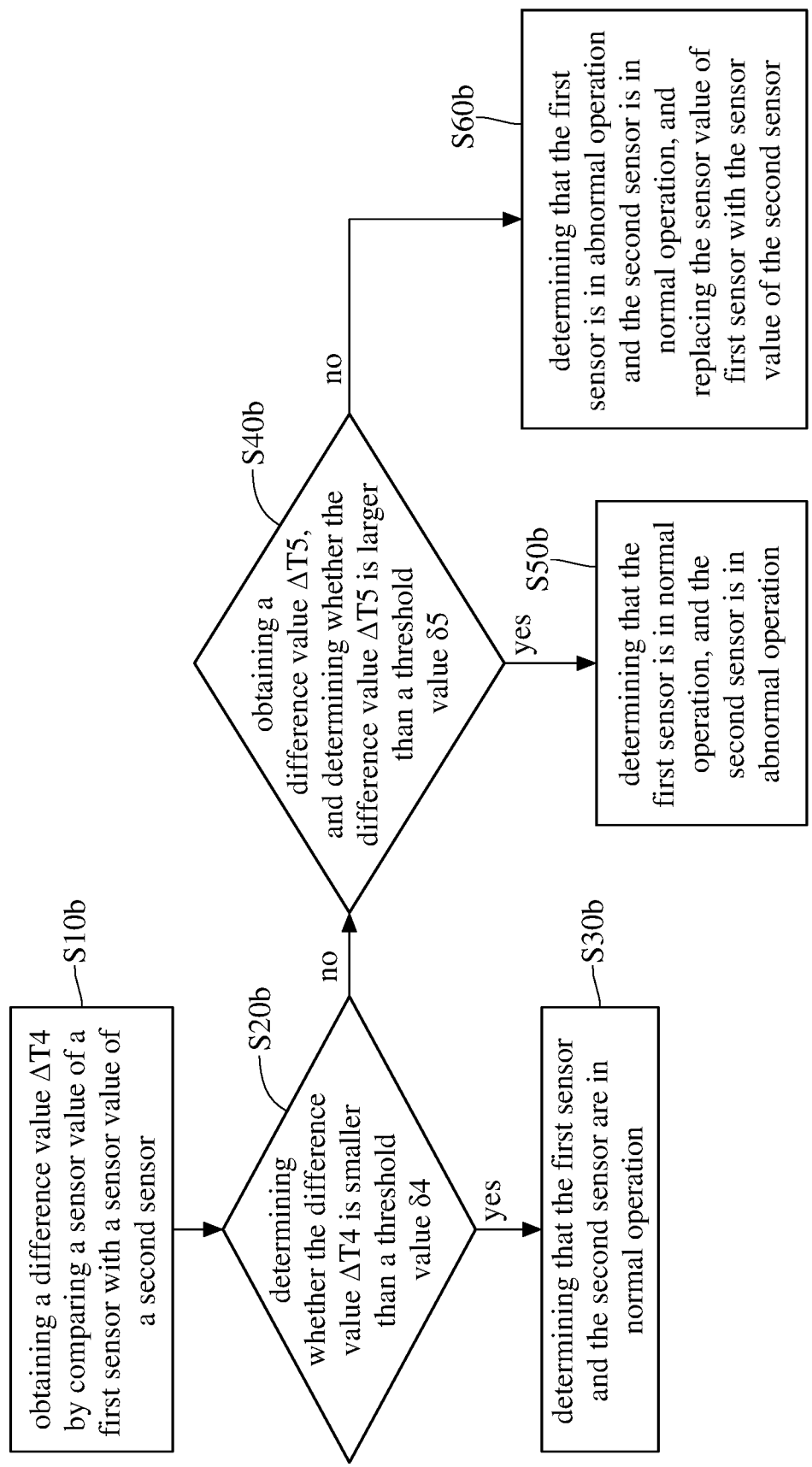
FIG. 3 is a flow chart of a method for verifying immersion cooling system according to a second embodiment of the disclosure.

Please refer to FIG. 1 and FIG. 3 together. FIG. 3 is a flow chart of a method for verifying immersion cooling system according to a second embodiment of the disclosure.

In this embodiment, a method for verifying immersion cooling system includes a plurality of steps—step S10b to step S60b: step S10b includes obtaining a difference value ΔT4 of an immersion cooling system 1 by comparing a sensor value of a first sensor 210b with a sensor value of a second sensor 220b; step S20b includes determining whether the difference value ΔT4 is smaller than a threshold value δ4; step S30b is performed when the difference value ΔT4 is smaller than the threshold value δ4, wherein the step S30b includes determining that the first sensor 210b and the second sensor 220b are in normal operation; step S40b is performed when the difference value ΔT4 is not smaller than the threshold value δ4, wherein the step S40b includes obtaining a difference value ΔT5 of the immersion cooling system 1 through the first sensor 210b and a third sensor 230b, and determining whether the difference value ΔT5 is larger than a threshold value δ5; step S50b is performed when the difference value ΔT5 is larger than the threshold value δ5, wherein the step S50b includes determining that the first sensor 210b is in normal operation, and the second sensor 220b is in abnormal operation; step S60b is performed when the difference value ΔT5 is not larger than the threshold value δ5, wherein the step S60b includes determining that the first sensor 210b is in abnormal operation and the second sensor 220b is in normal operation, and replacing the sensor value of first sensor 210b with the sensor value of the second sensor 220b.

For example, the first sensor 210b and the second sensor 220b are able to detect coolant temperature in the output tube 22, and the third sensor 230b is able to detect coolant temperature in the input tube 21. When the difference value ΔT4, between the sensor value of the first sensor 210b and the sensor value of the first sensor 210b, is smaller than the threshold value δ4, such as 2° C., it is determined that the first sensor 210b and the second sensor 220b are in normal operation. When the difference value ΔT4 is larger than the threshold value δ4, there is a need to further compare the difference value ΔT5, between the first sensor 210b and the third sensor 230b, with the threshold value δ5 to determine which of the first sensor 210b and the second sensor 220b is in normal operation. When the difference value ΔT5 is larger than the threshold value δ5, it is determined that the first sensor 210b is in normal operation, and the second sensor 220b is in abnormal operation. On the contrary, when the difference value ΔT5 is smaller than the threshold value δ5, it is determined that the first sensor 210b is in abnormal operation, and the second sensor 220b is in normal operation. Therefore, the abnormal sense value of the first sensor 210b would be replaced with the normal sense value of the second sensor 220b.

Figure 4A:
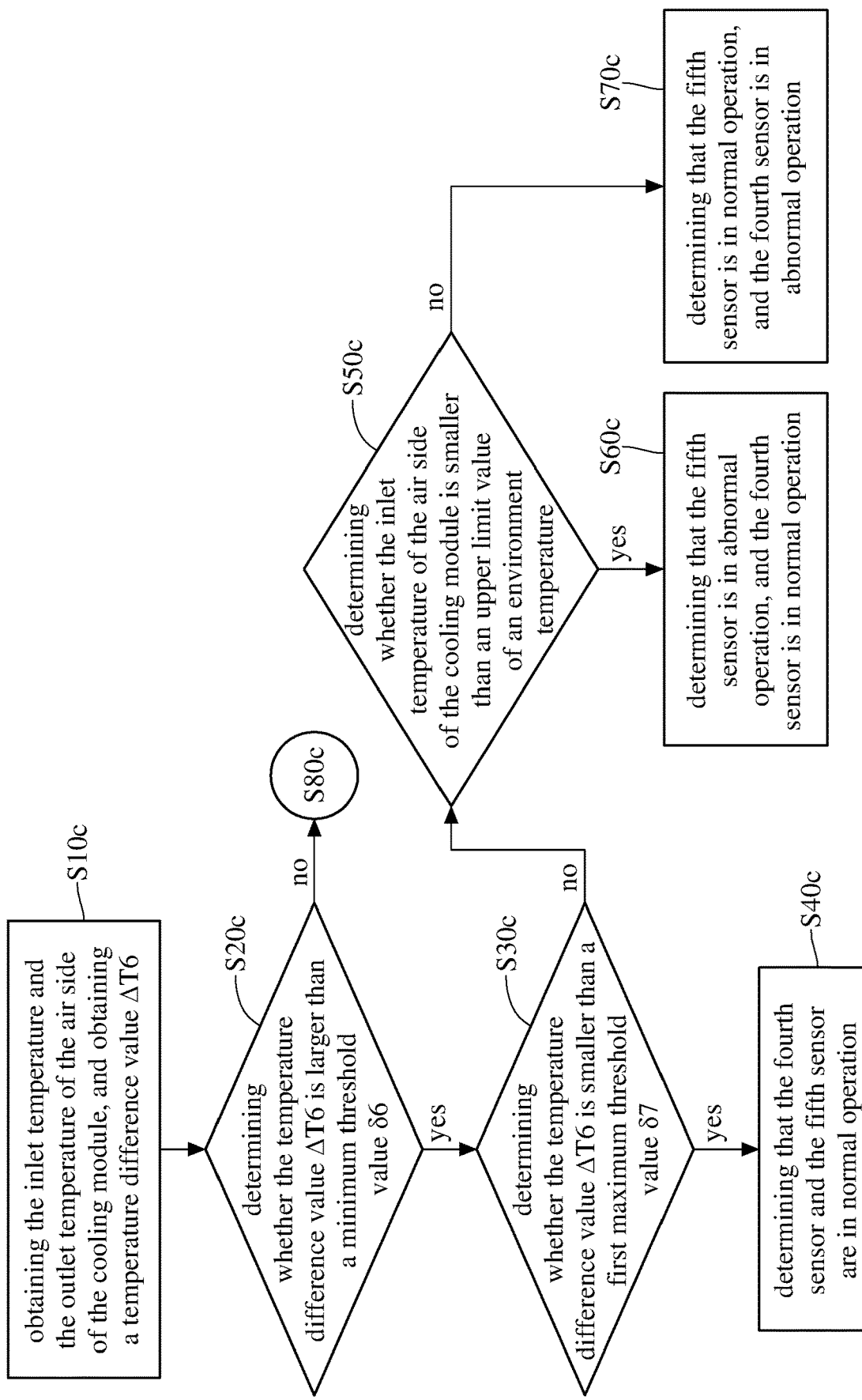
FIG. 4A is a part of a flow chart of a method for verifying immersion cooling system according to a third embodiment of the disclosure.
Figure 4B:
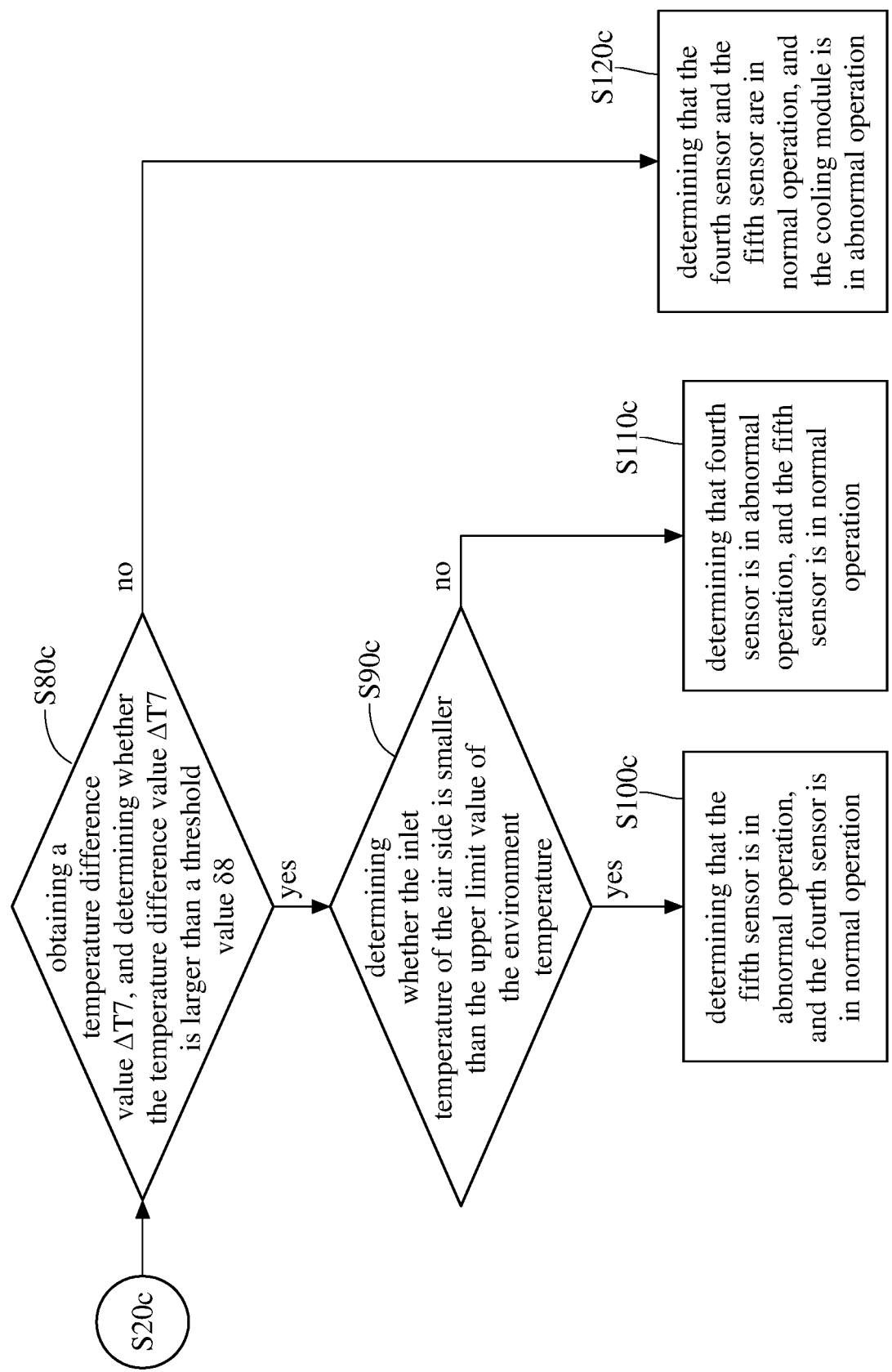
FIG. 4B is the other part of the flow chart of the method for verifying immersion cooling system according to the third embodiment of the disclosure.

Please refer to FIG. 1, FIG. 4A and FIG. 4B together. FIG. 4A is a part of a flow chart of a method for verifying immersion cooling system according to a third embodiment of the disclosure. FIG. 4B is the other part of the flow chart of the method for verifying immersion cooling system according to the third embodiment of the disclosure.

In this embodiment, the immersion cooling system 1 further includes a fourth sensor 310c, a fifth sensor 320c, a sixth sensor 330c and a seventh sensor 340c. A method is configured to verify the operation conditions of the fourth sensor 310c and fifth sensor 320c that are respectively used to detect an inlet temperature and an outlet temperature of the air side 242 of the cooling module 24 in the immersion cooling system 1. The method includes a plurality of steps—S10c to S120c: step S10c includes obtaining the inlet temperature and the outlet temperature of the air side 242 of the cooling module 24 respectively through the fourth sensor 310c and the fifth sensor 320c, and obtaining a temperature difference value ΔT6 by comparing the inlet temperature and the outlet temperature of the air side 242 of the cooling module 24; step S20c includes determining whether the temperature difference value ΔT6 is larger than a minimum threshold value δ6; step S30c is performed when the temperature difference value ΔT6 is larger than the minimum threshold value δ6, wherein the step S30c includes determining whether the temperature difference value ΔT6 is smaller than a first maximum threshold value δ7; step S40c is performed when the temperature difference value ΔT6 is smaller than the maximum threshold value δ7, wherein the step S40c includes determining that the fourth sensor 310c and the fifth sensor 320c are in normal operation; step S50c is performed when the temperature difference value ΔT6 is not smaller than the maximum threshold value δ7, wherein the step S50c includes determining whether the inlet temperature of the air side 242 of the cooling module 24 is smaller than an upper limit value of an environment temperature; step S60c is performed when the inlet temperature of the air side 242 of the cooling module 24 is smaller than the upper limit value of the environment temperature, wherein the step S60c includes determining that the fifth sensor 320c is in abnormal operation, and the fourth sensor 310c is in normal operation; step S70c is performed when the inlet temperature of the air side 242 of the cooling module 24 is not smaller than the upper limit value of the environment temperature, wherein the step S70c includes determining that the fourth sensor 310c is in abnormal operation, and the fifth sensor 320c is in normal operation.

Please refer back to the step S20c to determine whether the temperature difference value ΔT6 is larger than the minimum threshold value δ6. Step S80c is performed when the temperature difference value ΔT6 is not larger than the minimum threshold value δ6, wherein the step S80c includes obtaining a temperature difference value ΔT7 by comparing an inlet temperature with an outlet temperature of the liquid side 241 of the cooling module 24 that are respectively detected by the sixth sensor 330c and the seventh sensor 340c, and determining whether the temperature difference value ΔT7 is larger than a threshold value δ8. Step S90c is performed when the temperature difference value ΔT7 is larger than the threshold value δ8, wherein the step S90c includes determining whether the inlet temperature of the air side 242 is smaller than the upper limit value of the environment temperature. Step S100c is performed when the inlet temperature of the air side 242 is smaller than the upper limit value of the environment temperature, wherein the step S100c includes determining that the fifth sensor 320c is in abnormal operation, and the fourth sensor 310c is in normal operation. Step S110c is performed when the inlet temperature of the air side 242 is not smaller than the upper limit value of the environment temperature, wherein the step S110c includes determining that fourth sensor 310c is in abnormal operation, and the fifth sensor 320c is in normal operation.

Please refer back to the step S80c to determine whether the temperature difference value ΔT7 is larger than the threshold value δ8. Step S120c is performed when the temperature difference value ΔT7 is not larger than the threshold value δ8, wherein the step S120c includes determining that the fourth sensor 310c and the fifth sensor 320c are in normal operation, and the cooling module 24 is in abnormal operation.

For example, the fourth sensor 310c and the fifth sensor 320c are able to detect the inlet temperature and outlet temperature of the air side 242 of the cooling module 24, respectively, and the sixth sensor 330c and the seventh sensor 340c are able to detect the inlet temperature and the outlet temperature of the liquid side 241 of the cooling module 24, respectively.

When the temperature difference value ΔT6, between the fourth sensor 310c and the fifth sensor 320c, is larger than the minimum threshold value δ6, then it has a need to further determine whether the temperature difference value ΔT6 is smaller than the maximum threshold value δ7. When the temperature difference value ΔT6 is smaller than the maximum threshold value δ7, it is determined that the temperature difference value ΔT6 is between the minimum threshold value δ6 and the maximum threshold value δ7; that is, the fourth sensor 310c and the fifth sensor 320c are in normal operation. When the temperature difference value ΔT6 is larger than the maximum threshold value δ7, the operating condition of the fourth sensor 310c or the fifth sensor 320c is determined by a relationship between the inlet temperature of the air side 242 of the cooling module 24 and the environment temperature.

When the temperature difference value ΔT6 is larger than the maximum threshold value δ7, it is determined that one of the fourth sensor 310c and the fifth sensor 320c is in abnormal operation. Then, to determine whether the inlet temperature detected by fourth sensor 310c is smaller than the environment temperature; when the inlet temperature is smaller than the environment temperature, it is determined that the fifth sensor 320c is in abnormal operation, and the fourth sensor 310c is in normal operation. In contrast, when the inlet temperature is not smaller than the environment temperature, it is determined that the fourth sensor 310c is in abnormal operation, and the fifth sensor 320c is in normal operation.

When the temperature difference value ΔT6 is smaller than the minimum threshold value δ6, the temperature difference value ΔT7, between the sixth sensor 330c and the seventh sensor 340c, is compared with the threshold value δ8 to determine which one of the fourth sensor 310c and the fifth sensor 320c is in abnormal operation. When the temperature difference value ΔT7 is larger than the threshold value δ8, it is determined that inlet temperature is larger than the outlet temperature of the liquid side 241 of the cooling module 24; that is, the cooling module 24 is in normal operation. Therefore, it is abnormal for the temperature difference value ΔT6 being smaller than the minimum threshold value δ6 while the cooling module 24 is in normal operation; thus, it is determined that one of the fourth sensor 310c and the fifth sensor 320c is in abnormal operation.

When the sensor value of the fourth sensor 310c is smaller than the upper limit of the environment temperature, it is determined that the fifth sensor 320c is in abnormal operation, and the fourth sensor 310c is in normal operation. On the contrary, when the sensor value of the fourth sensor 310c is larger than the upper limit of the environment temperature, it is determined that the fourth sensor 310c is in abnormal operation, and the fifth sensor 320c is in normal operation.

When the temperature difference value ΔT7 is smaller than the threshold value δ8, it is determined that the inlet temperature and the outlet temperature of the liquid side 241 of the cooling module 24 is close to each other; that is, the coolant in the cooling module 24 is delivered to the heat radiator 23 while its temperature is not cooled by the air side 242 of the cooling module 24; in such a case, the cooling module 24 is determined malfunction (i.e. in abnormal operation).

Figure 5:
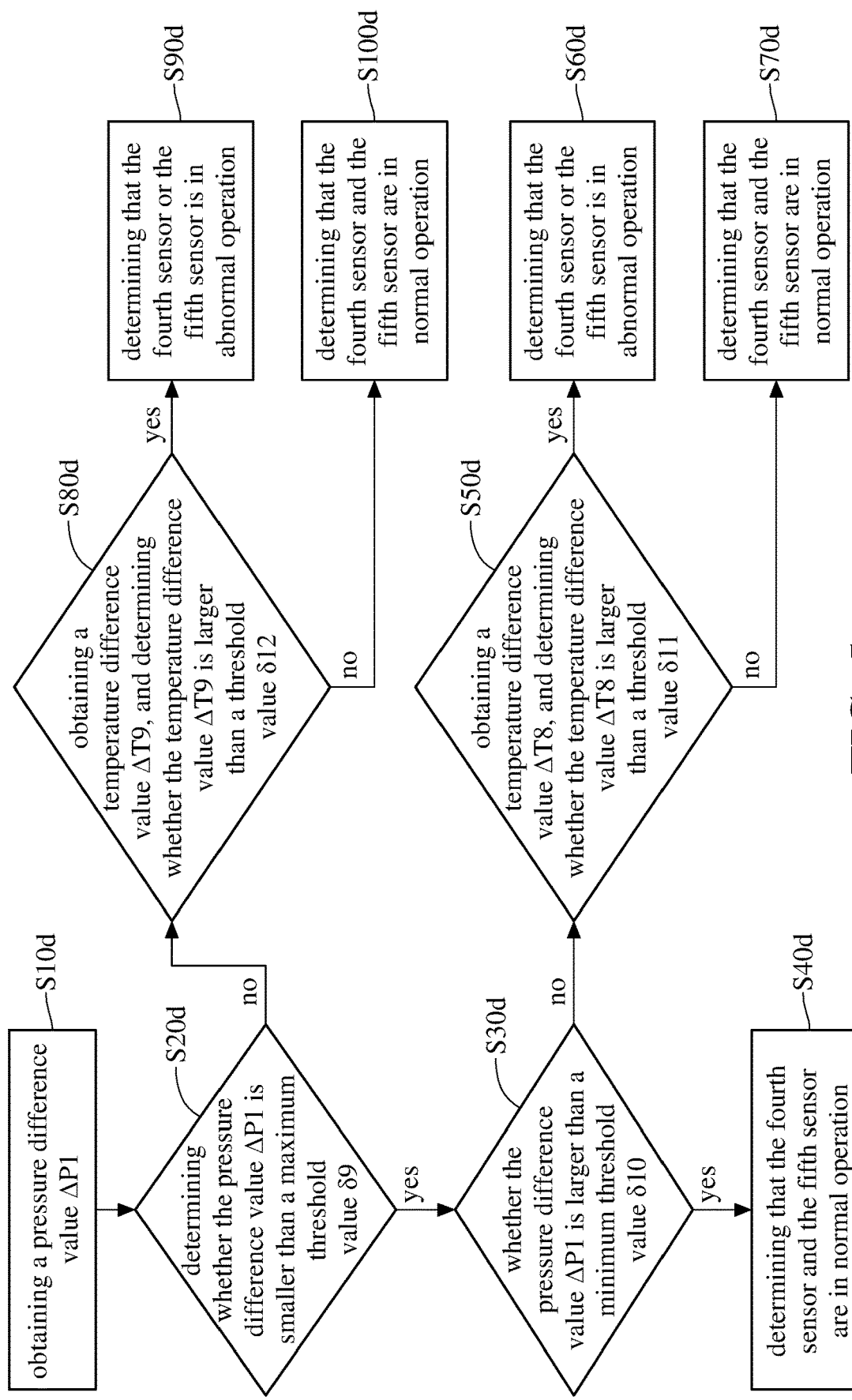
FIG. 5 is a flow chart of a method for verifying immersion cooling system according to a fourth embodiment of the disclosure.

Please refer to FIG. 1 and FIG. 5 together. FIG. 5 is a flow chart of a method for verifying immersion cooling system according to a fourth embodiment of the disclosure.

In this embodiment, the immersion cooling system 1 further includes a fourth sensor 410d, a fifth sensor 420d, a sixth sensor 430d and a seventh sensor 440d. A method for verifying immersion cooling system includes a plurality of steps—step S10d to step S100d: step S10d includes obtaining a pressure difference value ΔP1 by comparing a tank pressure inside the liquid storage tank 10 of the immersion cooling system 1 with an outside pressure that are respectively detected by the fourth sensor 410d and the fifth sensor 420d; step S20d includes determining whether the pressure difference value ΔP1 is smaller than a maximum threshold value δ9; step S30d is performed when the pressure difference ΔP1 value is smaller than the maximum threshold value δ9, wherein the step S30d includes whether the pressure difference value ΔP1 is larger than a minimum threshold value δ10; step S40d is performed when the pressure difference value ΔP1 is larger than the minimum threshold value δ10, wherein the step S40d includes determining that the fourth sensor 410d and the fifth sensor 420d are in normal operation; step S50d is performed when the pressure difference value ΔP1 is not larger than the minimum threshold value δ10, wherein the step S50d includes obtaining a temperature difference value ΔT8 by comparing a gas temperature inside the liquid storage tank 10 of the immersion cooling system 1 detected by the sixth sensor 430d with an inlet temperature of the air side 242 of the cooling module 24 detected by the seventh sensor 440d, and determining whether the temperature difference value ΔT8 is larger than a threshold value δ11; step S60d is performed when the temperature difference value ΔT8 is larger than the threshold value δ11, wherein the step S60d includes determining that the fourth sensor 410d or the fifth sensor 420d is in abnormal operation; step S70d is performed when the temperature difference value ΔT8 is not larger than the threshold value δ11, wherein step S70d includes determining that the fourth sensor 410d and the fifth sensor 420d are in normal operation, and the immersion cooling system 1 is in a condition of sucking air from outside.

Please refer back to step S20d to determine whether the pressure difference value ΔP1 is smaller than the maximum threshold value δ9. The step S80d is performed when the pressure difference value ΔP1 is not smaller than the maximum threshold value δ9, wherein the step S80d includes obtaining a temperature difference value ΔT9 by comparing the gas temperature inside the liquid storage tank 10 which is detected by the sixth sensor 430d with a boiling temperature of the dielectric fluid in the liquid storage tank 10, and determining whether the temperature difference value ΔT9 is larger than a threshold value δ12. The step S90d is performed when the temperature difference value ΔT9 is larger than the threshold value δ12, wherein the step S90d includes determining that the fourth sensor 410d or the fifth sensor 420d is in abnormal operation. The step S100d is performed when the temperature difference value ΔT9 is not larger than the threshold value δ12, wherein step S100d includes determining that the fourth sensor 410d and the fifth sensor 420d are in normal operation, and increasing the performance of the cooling module 24.

For example, the fourth sensor 410d and the fifth sensor 420d are able to detect the tank pressure of the liquid tank 10 of the immersion cooling system 1 and the outside pressure, respectively, the sixth sensor 430 is able to detect the gas temperature inside the liquid storage tank 10, and the seventh sensor 440d is able to detect the inlet temperature of the air side 242 of the cooling module 24. When the pressure difference value ΔP1 between the tank pressure and the outside pressure is smaller than the maximum threshold value δ9, then it is determined whether the pressure difference value ΔP1 is larger than the minimum threshold value δ10. When the pressure difference value ΔP1 is between the maximum threshold value δ9 and the minimum threshold value δ10, it is determined that the fourth sensor 410d and the fifth sensor 420d are in normal operation. When the pressure difference value ΔP1 is smaller than the minimum threshold value δ10, the operating condition of the fourth sensor 410d or the fifth sensor 420d is determined by comparing the temperature difference value ΔT8 between the sixth sensor 430d and the seventh sensor 440d with the threshold value δ11.

When the temperature difference value ΔT8 is larger than the threshold value δ11, such as 0° C., it is determined that the fourth sensor 410d or the fifth sensor 420d is in abnormal operation. In other words, the gas temperature in the liquid storage tank 10 is still larger than the inlet temperature of the air side 242 of the cooling module 24; that is, the pressure difference value ΔP1 between the tank pressure and the outside pressure should be larger than the minimum threshold value δ10, but in fact it is smaller than the minimum threshold value δ10. Therefore, it is determined that one of the fourth sensor 410d or the fifth sensor 420d is in abnormal operation. When the temperature difference value ΔT8 is smaller than the threshold value δ11, it is determined that the gas temperature in the liquid storage tank 10 is smaller than the inlet temperature of the air side 242 of the cooling module 24. In other words, the pressure difference value ΔP1 between the tank pressure and the outside pressure is actually smaller than the minimum threshold value δ10; that is, the fourth sensor 410d and the fifth sensor 420d are in normal operation.

When the pressure difference value ΔP1 is larger than the maximum threshold value δ9, the operating condition of the fourth sensor 410d or the fifth sensor 420d is determined by the temperature difference value ΔT9 between the gas temperature of the liquid storage tank 10 and the boiling temperature of the dielectric fluid 2.

When the temperature difference value ΔT9 is smaller than the threshold value δ12, such as 0° C., it is determined that the gas temperature is close to the boiling temperature of the dielectric fluid 2. In other words, in practical, there is a lot of vapor of the dielectric fluid 2 produced in the liquid storage tank 10, such that the pressure difference value ΔP1 between the tank pressure and the outside pressure is actually larger than the maximum threshold value δ9; that is, the fourth sensor 410d and the fifth sensor 420d are in normal operation. In order to prevent the vapor of the dielectric fluid 2 from losing due to the overly large tank pressure, the performance of the cooling module 24 is required to be increased in order to rapidly condense the dielectric fluid 2 in gaseous form into liquid form. On the contrary, when the temperature difference value ΔT9 is larger than the threshold value δ12, it is determined that the gas temperature is smaller than the boiling temperature of the dielectric fluid 2. In other words, the pressure difference value ΔP1 between the tank pressure and the outside pressure should be smaller than the maximum threshold value δ9, but in fact it is larger than the maximum threshold value δ9. Therefore, it is determined that one of the fourth sensor 410d and the fifth sensor 420d is abnormal operation.

Figure 6:
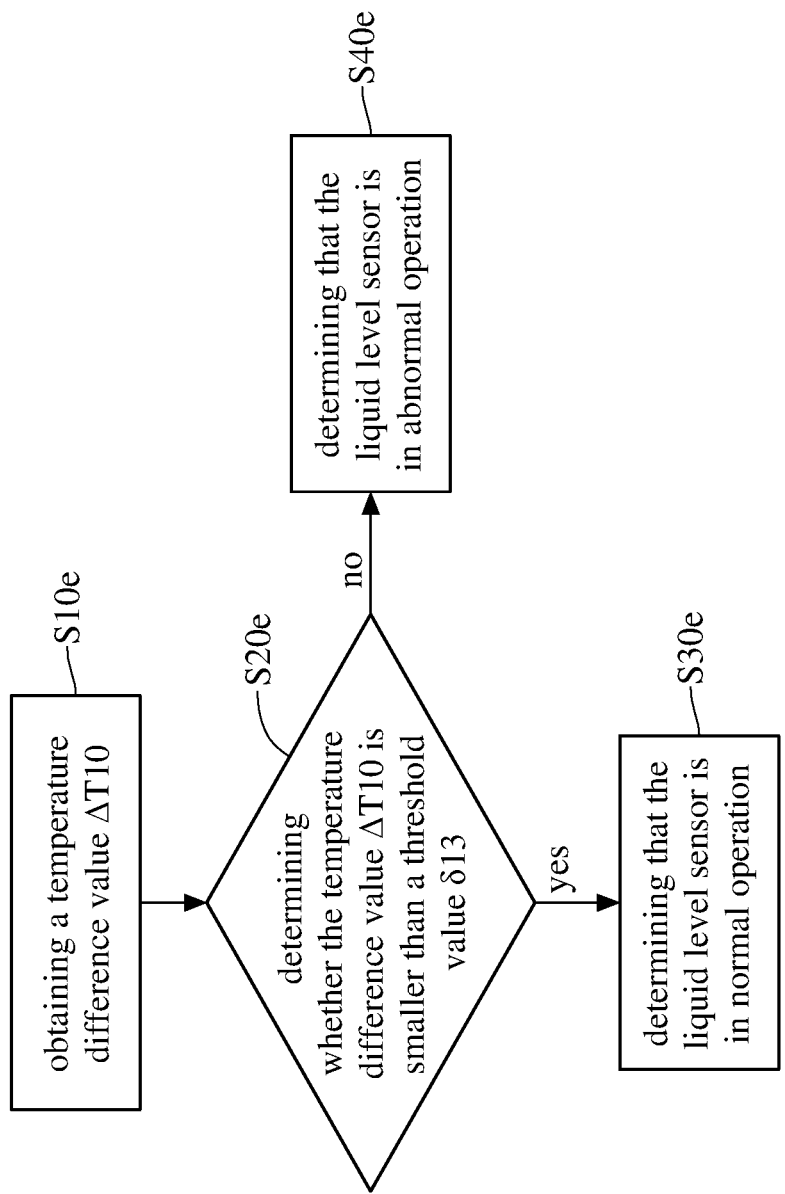
FIG. 6 is a flow chart of a method for verifying immersion cooling system according to a fifth embodiment of the disclosure.

Please refer to FIG. 1 and FIG. 6 together. FIG. 6 is a flow chart of a method for verifying immersion cooling system according to a fifth embodiment of the disclosure.

In this embodiment, the immersion cooling system 1 further includes a liquid level sensor 510e. A method for verifying immersion cooling system includes a plurality of steps—step S10e to step S40e; step S10e includes obtaining a temperature difference value ΔT10 by comparing a gas temperature inside the liquid storage tank 10 with a tank temperature above liquid level of the dielectric fluid in the immersion cooling system 1 which is detected by the liquid level sensor 510e; step S20e includes determining whether the temperature difference value ΔT10 is smaller than a threshold value δ13; step S30e is performed when the temperature difference value ΔT10 is smaller than the threshold value δ13, wherein the step S30e includes determining that the liquid level sensor 510e is in normal operation; step S40e is performed when the temperature difference value ΔT10 is not smaller than the threshold value δ13, wherein the step S40e includes determining that the liquid level sensor 510e is in abnormal operation.

For example, the liquid level sensor 510e is able to detect the liquid level of the dielectric fluid 2, and the position of the liquid level sensor 510e is the same as the liquid level of the dielectric fluid 2. In general, when the immersion cooling system 1 is in normal operation, the evaporation rate of the dielectric fluid 2 almost equals to the rate of the condensation of the dielectric fluid 2; that is, the liquid level of the dielectric fluid 2 is maintained in the same level. When the immersion cooling system 1 is in full-load operation, some of the vapor of the dielectric fluid 2 is unable to be condensed into the liquid immediately, such that the liquid level of the dielectric fluid 2 is decreasing so as to expose the liquid level sensor 510e. At this moment, the liquid level sensor 510e is activated to detect the tank temperature of the liquid storage tank 10, and the operating condition of the liquid level sensor 510e is determined by the temperature difference value ΔT10 between the tank temperature and the gas temperature. When the temperature difference value ΔT10 is smaller than the threshold value δ13, such as 2° C., it is determined that the liquid level sensor 510e is in normal operation; that is, the decreasing level of the dielectric fluid 2 is caused by the full-load operation of the immersion cooling system 1. In contrast, when the temperature difference value ΔT10 between the tank temperature and the gas temperature is larger than the threshold value δ13, it is determined that the liquid level sensor 510e is in abnormal operation.

Figure 7:
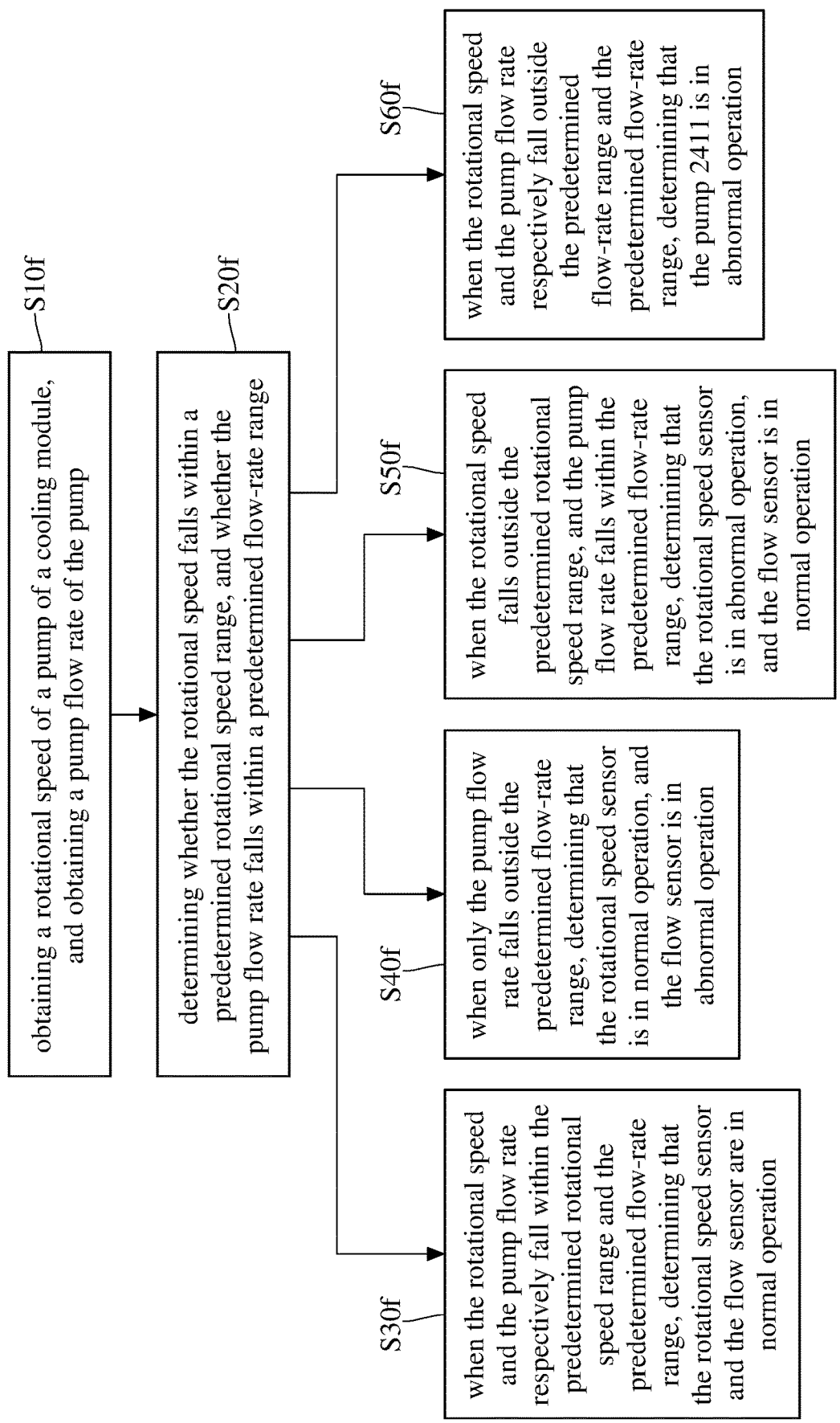
FIG. 7 is a flow chart of a method for verifying immersion cooling system according to a sixth embodiment of the disclosure.

Please refer to FIG. 1 and FIG. 7 together. FIG. 7 is a flow chart of a method for verifying immersion cooling system according to a sixth embodiment of the disclosure.

In this embodiment, the immersion cooling system 1 further includes a rotational speed sensor 610f and a flow sensor 620f. A method for verifying the immersion cooling system includes step S10f to step S60f: step S10f includes obtaining a rotational speed of a pump 2411 of a cooling module 24 by the rotational speed sensor 610f, and obtaining a pump flow rate of the pump 2411 by the flow sensor 620f, while the pump 2411 is in full-load operation; step S20f includes determining whether the rotational speed falls within a predetermined rotational speed range, and whether the pump flow rate falls within a predetermined flow-rate range; step S30f is performed when the rotational speed falls within the predetermined rotational speed range, and the pump flow rate falls within the predetermined flow-rate range, wherein the step S30f includes determining that the rotational speed sensor 610f and the flow sensor 620f are in normal operation; step S40f is performed only when the pump flow rate falls outside the predetermined flow-rate range, wherein the step S40f includes determining that the rotational speed sensor 610f is in normal operation, and the flow sensor 620f is in abnormal operation; step S50f is performed when the rotational speed falls outside the predetermined rotational speed range, and the pump flow rate falls within the predetermined flow-rate range, wherein the step S50f includes determining that the rotational speed sensor 610f is in abnormal operation, and the flow sensor 620f is in normal operation; step S60f is performed when the rotational speed and the pump flow rate respectively fall outside the predetermined flow-rate range and the predetermined flow-rate range, wherein and the step S60f includes determining that the pump 2411 is in abnormal operation.

When the rotational speed and the pump flow rate respectively falls within the predetermined rotational speed range and the predetermined flow-rate range, it is determined that the rotational speed sensor 610f and the flow sensor 620f is in normal operation. When one of the rotational speed and the pump flow rate falls outside the predetermined rotational speed range and the predetermined flow-rate range, it is determined that one of the rotational speed sensor 610f and the flow sensor 620f is in abnormal operation. When the pump flow rate falls outside the predetermined flow-rate range, it is determined that the flow sensor 620f is in abnormal operation, and the rotational speed sensor 610f is in normal operation. On the contrary, when the rotational speed falls outside the predetermined rotational speed range, it is determined that the rotational speed sensor 610f is in abnormal operation, and the flow sensor 620f is in normal operation. When the rotational speed and the pump flow rate respectively fall outside the predetermined rotational speed range and the predetermined flow-rate range, it is determined that the pump 2411 is in abnormal operation.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:

1. A method for verifying an immersion cooling system, the immersion cooling system comprising a first sensor, a second sensor and at least one third sensor, the method comprising:
    obtaining a first difference value of the immersion cooling system by comparing a sensor value of the first sensor with a sensor value of the second sensor; and
    determining whether the first difference value is smaller than a first threshold value;
        determining that the first sensor and the second sensor are in normal operation when the first difference value is smaller than the first threshold value; and
        when the first difference value is not smaller than the first threshold value, determining an operating condition of the first sensor or the second sensor according to a relationship between a sensor value of the at least one third sensor and the sensor value of the first sensor, or a relationship between the sensor value of the at least one third sensor and the sensor value of the second sensor.

2. The method according to the claim 1, further comprising:
    obtaining a second difference value of the immersion cooling system by comparing the sensor value of the first sensor with the sensor value of the at least one third sensor, and determining whether the second difference value is smaller than a second threshold value;
    determining that the first sensor is in normal operation and the second sensor is in abnormal operation when the second difference value is smaller than the second threshold value; and
    when the second difference value is not smaller than the second threshold value, determining that the first sensor is in abnormal operation, obtaining a third difference value by comparing the sensor value of the second sensor with the sensor value of the at least one third sensor, and determining whether the third difference value is smaller than a third threshold value;
        when the third difference value is smaller than the third threshold value, determining that the second sensor and the at least one third sensor are in normal operation, and replacing the sensor value of the first sensor with the sensor value of the at least one third sensor; and
        determining that the second sensor is in abnormal operation when the third difference value is not smaller than the third threshold value.

3. The method according to the claim 1, wherein the quantity of the at least one third sensor is plural, and the method further comprises:
    obtaining a second difference value of the immersion cooling system by comparing the sensor value of the first sensor with an average sensor value of the third sensors, and determining whether the second difference value is smaller than a second threshold value;
    determining that the first sensor is in normal operation and the second sensor is in abnormal operation when the second difference value is smaller than the second threshold value; and
    when the second difference value is not smaller than the second threshold value, determining that the first sensor is in abnormal operation, obtaining a third difference value by comparing the sensor value of the second sensor with the average sensor value of the third sensors, and determining whether the third difference value is smaller than a third threshold value;
        when the third difference value is smaller than the third threshold value, determining that the second sensor and the third sensors are in normal operation, and replacing the sensor value of the first sensor with the highest sensor value of the third sensors; and
        when the third difference value is not smaller than the third threshold value, determining that the second sensor is in abnormal operation, and determining operation conditions of the third sensors according to the sensor values of the third sensors.

4. The method according to the claim 1, further comprising:
    obtaining a second difference value of the immersion cooling system through the first sensor and the at least one third sensor, and determining whether the second difference value is larger than a second threshold value;
    determining that the first sensor is in normal operation and the second sensor is in abnormal operation when the second difference value is larger than the second threshold value; and
    when the second difference value is not larger than the second threshold value, determining that the first sensor is in abnormal operation and the second sensor is in normal operation, and replacing the sensor value of the first sensor with the sensor value of the second sensor.

5. The method according to the claim 1, wherein the immersion cooling system further comprises a fourth sensor and a fifth sensor, and the method further comprises:
    obtaining an inlet temperature and an outlet temperature of an air side of a cooling module of the immersion cooling system respectively through the fourth sensor and the fifth sensor, and obtaining a first temperature difference value by comparing the inlet temperature with the outlet temperature; and
    determining whether the first temperature difference value is larger than a minimum threshold value;
        determining whether the first temperature difference value is smaller than a maximum threshold value when the first temperature difference value is larger than the minimum threshold value;
        determining that the fourth sensor and the fifth sensor are in normal operation when the first temperature difference value is smaller than the maximum threshold value; and
        when the first temperature difference value is not smaller than the maximum threshold value, determining an operation condition of the fourth sensor or the fifth sensor according to a relationship between the inlet temperature of the air side of the cooling module and an environment temperature; and when the first temperature difference value is not larger than a minimum threshold value, determining the operation condition of the fourth sensor, the fifth sensor or the cooling module according to an inlet temperature and an outlet temperature of a liquid side of the cooling module.

6. The method according to the claim 5, wherein the immersion cooling system further comprises a sixth sensor and a seventh sensor, and the method further comprises:

obtaining a second temperature difference value by comparing the inlet temperature with the outlet temperature of the liquid side of the cooling module that are respectively detected by the sixth sensor and the seventh sensor; and determining whether the second temperature difference value is larger than a threshold value;

determining whether the inlet temperature of the air side of the cooling module is smaller than an upper limit value of the environment temperature when the second temperature difference value is larger than the threshold value;

determining that the fifth sensor is in abnormal operation and the fourth sensor is in normal operation when the inlet temperature of the air side of the cooling module is smaller than the upper limit value of the environment temperature;

determining that the fourth sensor is in abnormal operation and the fifth sensor is in normal operation when the inlet temperature of the air side of the cooling module is not smaller than the upper limit value of the environment temperature; and determining that the fourth sensor and the fifth sensor are in normal operation and the cooling module is in abnormal operation when the second temperature difference value is not larger than the threshold value.

7. The method according to the claim 1, wherein the immersion cooling system further comprises a fourth sensor and a fifth sensor, and the method further comprises:

obtaining a pressure difference value by comparing a tank pressure inside a liquid storage tank of the immersion cooling system with an outside pressure that are respectively detected by the fourth sensor and the fifth sensor; and determining whether the pressure difference value is smaller than a maximum threshold value;

determining whether the pressure difference value is larger than a minimum threshold value when the pressure difference value is smaller than the maximum threshold value;

determining that the fourth sensor and the fifth sensor are in normal operation when the pressure difference value is larger than the minimum threshold value;

when the pressure difference value is not larger than the minimum threshold value, determining an operation condition of the fourth sensor or the fifth sensor according to a relationship between a gas temperature inside the liquid storage tank and an inlet temperature of an air side of a cooling module of the immersion cooling system; and when the pressure difference value is not smaller than the maximum threshold value, determining the operation condition of the fourth sensor or the fifth sensor according to the gas temperature and a boiling temperature of a dielectric fluid in the liquid storage tank.

8. The method according to the claim 7, wherein the immersion cooling system further comprises a sixth sensor, and the method further comprises:

obtaining a temperature difference value by comparing the gas temperature inside the liquid storage tank which is detected by the sixth sensor with the boiling temperature of the dielectric fluid; and determining whether the temperature difference value is larger than a threshold value;

determining that the fourth sensor or the fifth sensor is in abnormal operation when the temperature difference value is larger than the threshold value; and determining that the fourth sensor and the fifth sensor are in normal operation when the temperature difference value is not larger than the threshold value.

9. The method according to the claim 1, wherein the immersion cooling system further comprises a liquid level sensor, and the method further comprises:

obtaining a temperature difference value by comparing a tank temperature above a liquid level of a dielectric fluid in the immersion cooling system which is detected by the liquid level sensor with a gas temperature inside a liquid storage tank; and determining whether the temperature difference value is smaller than a threshold value;

determining that the liquid level sensor is in normal operation when the temperature difference value is smaller than the threshold value; and determining that the liquid level sensor is in abnormal operation when the temperature difference value is not smaller than the threshold value.

\* \* \* \* \*